United States Patent
Clark

(10) Patent No.: US 12,537,523 B1
(45) Date of Patent: Jan. 27, 2026

(54) TUNABLE COUPLER WITH CONTROLLED IMPEDANCE STATES

(71) Applicant: NORTHROP GRUMMAN SYSTEMS CORPORATION, Falls Church, VA (US)

(72) Inventor: Jeremy Brendon Clark, Washington Township, OH (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 2 days.

(21) Appl. No.: 18/787,418

(22) Filed: Jul. 29, 2024

(51) Int. Cl.
*H03K 17/92* (2006.01)

(52) U.S. Cl.
CPC .................. *H03K 17/92* (2013.01)

(58) Field of Classification Search
CPC ..................................... H03K 17/92
USPC ....................................... 327/528
See application file for complete search history.

(56) References Cited

U.S. PATENT DOCUMENTS

| | | | |
|---|---|---|---|
| 2019/0214971 A1* | 7/2019 | Keane | H03H 11/04 |
| 2025/0038722 A1* | 1/2025 | Swenson | H03F 7/00 |

* cited by examiner

*Primary Examiner* — Tomi Skibinski
(74) *Attorney, Agent, or Firm* — Tarolli, Sundheim, Covell & Tummino LLP

(57) ABSTRACT

A tunable coupler circuit is provided that includes a coupling superconductor quantum interference device (SQUID) having a first end configured to be coupled to a first resonator device and a second end configured to be coupled to a second resonator device. A first shunt SQUID coupled between the first coupling node and ground, and a second shunt SQUID coupled between the second coupling node and ground, wherein the tunable coupler circuit is configured to switch between a coupled state by the setting of the coupling SQUID to a low impedance state while concurrently setting the first shunt SQUID and the second shunt SQUID to a high impedance state and a decoupled state by setting the coupling SQUID to a high impedance state to decouple the first resonator device and the second resonator device while concurrently setting the first shunt SQUID and the second shunt SQUID to a low impedance state.

20 Claims, 4 Drawing Sheets

TUNABLE COUPLER WITH CONTROLLED IMPEDANCE STATES

GOVERNMENT INTEREST

The invention was made under Government Contract. Therefore, the US Government has rights to the invention as specified in that contract.

TECHNICAL FIELD

This disclosure relates generally to superconductor circuits, and specifically to tunable coupler with controlled impedance states.

BACKGROUND

Efficient coupling between resonator devices is a key step in the scaling of superconducting platforms. Fast and well-controlled tunable coupler circuits will be essential to achieve efficient coupling between resonator devices in superconducting computing applications. By tuning one or more parameters of the tunable coupler circuit, a desired coupling between the resonator devices may be achieved. A SQUID (superconducting quantum interference device) is a very sensitive magnetometer used to measure extremely weak magnetic fields, based on superconducting loops containing Josephson junctions. A SQUID may also act as a tunable inductor based on applying one or more external control parameters. In some examples, a tunable coupler circuit may be realized by using a SQUID.

SUMMARY

In one example, a tunable coupler circuit is provided that includes a coupling superconductor quantum interference device (SQUID) having a first end configured to be coupled to a first resonator device through a first coupling node and a second end configured to be coupled to a second resonator device through a second coupling node. A first shunt SQUID coupled between the first coupling node and ground, and a second shunt SQUID coupled between the second coupling node and ground, wherein the tunable coupler circuit is configured to switch between a coupled state by the setting of the coupling SQUID to a low impedance state to couple the first resonator device and the second resonator device together while concurrently setting the first shunt SQUID and the second shunt SQUID to a high impedance state and a decoupled state by setting the coupling SQUID to a high impedance state to decouple the first resonator device and the second resonator device while concurrently setting the first shunt SQUID and the second shunt SQUID to a low impedance state to provide current paths for both the first resonator device to ground and the second resonator device to ground.

In another example, a system is provided that includes a first resonator device having a first resonant frequency, a second resonator device having a second resonant frequency, and a tunable coupler circuit coupled between the first resonator device and the second resonator device. The tunable coupler circuit includes a coupling superconductor quantum interference device (SQUID) having a first end coupled to the first resonator device through a first coupling node and a second end coupled to the second resonator device through a second coupling node, a first shunt SQUID coupled between the first coupling node and ground, and a second shunt SQUID coupled between the second coupling node and ground. The tunable coupler circuit is configured to switch between a coupled state by the setting of the coupling SQUID to a low impedance state to couple the first resonator device and the second resonator device together while concurrently setting the first shunt SQUID and the second shunt SQUID to a high impedance state and a decoupled state by setting the coupling SQUID to a high impedance state to decouple the first resonator device and the second resonator device while concurrently setting the first shunt SQUID and the second shunt SQUID to a low impedance state to provide current paths for both the first resonator device to ground and the second resonator device to ground. The system further includes a control device configured to switch the tunable coupled circuit between the coupled state and the decoupled state.

In yet another example, a method is disclosed of coupling and decoupling first and second resonator devices via a tunable coupler circuit having a coupling superconductor quantum interference device (SQUID) having a first end coupled to a first resonator device and a first shunt SQUID coupled to ground, and a second end coupled to a second resonator device and aa second shunt SQUID coupled to ground. The method includes setting the tunable coupler circuit to a decoupled state by concurrently providing a first flux to the coupling SQUID to set the coupling SQUID to a high impedance state, while concurrently providing a second flux to the first shunt SQUID and the second shunt SQUID to set the first shunt SQUID and the second shunt SQUID to a low impedance state, or setting the tunable coupler circuit to a coupled state by concurrently providing a third flux to the coupling SQUID to set the coupling SQUID to a low impedance state, while concurrently providing a fourth flux to the first shunt SQUID and the second shunt SQUID to set the first shunt SQUID and the second shunt SQUID to a high impedance state.

DETAILED DESCRIPTION

Figure 1:
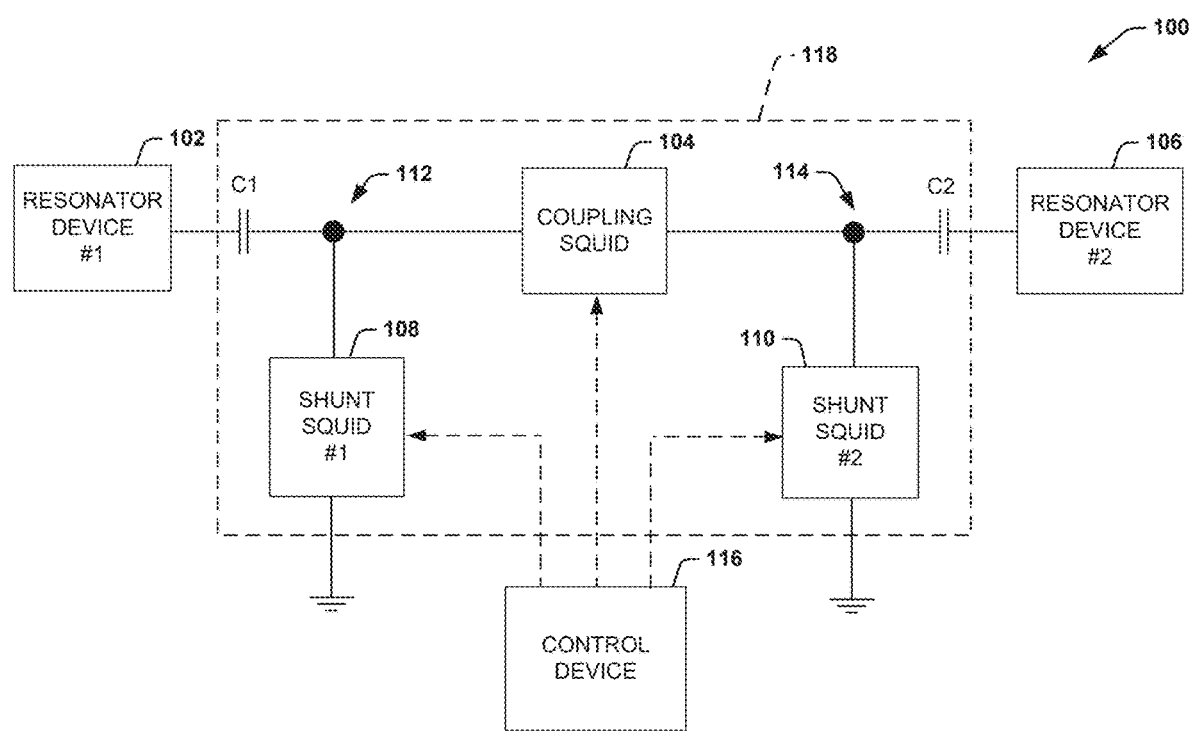
FIG. 1 illustrates an example of a superconductor system with a tunable coupler circuit.

This disclosure relates to tunable coupler systems and circuits, and specifically to tunable coupler systems and circuits that utilize superconducting quantum interference devices (SQUIDs) as tunable inductors. Tunable coupler circuits are utilized to facilitate communication/coupling between two resonator devices (e.g., two superconductor resonant circuits or devices). In some examples, a resonant frequency of the tunable coupler circuit is tuned/modified to modulate the coupling between the two resonator devices. In particular, when the resonant frequency of the tunable coupler circuit is tuned/modified to be near or at the resonant frequency of the two resonator devices, the tunable coupler circuit is turned on, thereby facilitating communication/coupling between the two resonator devices. Furthermore, when the resonant frequency of the tunable coupler circuit is tuned/modified to be farther away from the resonant frequency of the two resonator devices, the tunable coupler circuit is turned off, thereby hindering communication/coupling between the two resonator devices.

In an example of the present disclosure, the tunable coupler system and circuit provides a coupling SQUID configured to be disposed and coupled between two resonator devices. Furthermore, two shunt SQUIDS are disposed on opposite ends of the coupling SQUID. A control device is configured to provide a first control bias that set the tunable coupler to a first state, which sets the two shunt SQUIDS to a high impedance state or an 'OFF' state and the coupling SQUID to a low impedance state or an 'ON' state coupling the two resonator devices to one another. The control device is further configured to also provide a second control bias that set the tunable coupler to a second state, which sets the two shunt SQUIDS to a low impedance state or an 'ON' state providing a ground path for the two resonator devices, and the coupling SQUID to a high impedance state or an 'OFF' state decoupling the two resonator devices from one another.

Previous implementations of this type of coupler circuit have used two non-tunable linear inductors shunting currents to ground in lieu of two shunt SQUIDs. By extension, this design required the use of larger coupling capacitors (tens of F), which limits the usefulness of such a device when high impedance resonances are being coupled together (i.e., the capacitive load pulls these resonances down). The present tunable coupler systems and circuits can employ SQUIDs that includes a single Josephson junction (JJ), two Josephson junctions (JJs) or three JJs.

An additional advantage provided by this circuit is the ability to Impose a suitable 'OFF' state without the need for "trim" capacitors spanning the coupling nodes. Such trim capacitors are used to introduce coupling modes of opposite parity, providing a delicate destructive interference in the "off" state. Generally speaking, the margins on correctly targeting the value of the capacitance can be demanding (<1 F) in order to achieve a substantially perfect off state. Here, the ratio of critical currents between the center and shunt SQUIDs determines the 'OFF' level in a way that is robust to global scaling of critical currents and small degrees of junction asymmetry. Moreover, suitable small junctions in the coupling SQUID can be chosen to suitable reduce unwanted parasitic capacitance between the coupling nodes. Finally, since the inductive reactances in the circuit are oppositely driven, the coupler circuit's resonance frequency can stay high (typically >25 GHZ) through a comparatively large dynamic range of the coupling rate (<30 MHZ). This feature can be vital in cases where the coupler mode needs to remain far from participating modes or where thermal impurities need to be minimized.

FIG. 1 illustrates an example of a superconductor system 100 with a tunable coupler circuit 118. The superconductor system 100 includes a first resonator device #1 102 having a first resonant frequency, a second resonator device #2 106 having a second resonant frequency, and the tunable coupler circuit 118 coupled between the first resonator device #1 102 and the second resonator device #2 106. The tunable coupler circuit 118 includes a coupling SQUID 104 having a first end coupled to the first resonator device #1 102 through a first coupling node 112 and a second end coupled to the second resonator device #2 106 through a second coupling node 114. A first coupling capacitor C1 is disposed between the first coupling node 112 and the first resonator device #1 102, and a second coupling capacitor C2 is disposed between the second coupling node 114 and the second resonator device #2 106. A first shunt SQUID #1 108 is coupled between the first coupling node 112 and ground and a second shunt SQUID #2 110 is coupled between the second coupling node 114 and ground.

The superconductor system 100 also includes a control device 116 configured to set the coupling SQUID 104 to the 'ON' state coupling the first resonator device #1 102 and the second resonator device #2 106 together while concurrently setting the first shunt SQUID #1 108 and the second shunt SQUID #2 110 to the 'OFF' state. Furthermore, the control device 116 is configured to set the coupling SQUID 104 to the 'OFF' state decoupling the first resonator device #1 102 and the second resonator device #2 106, while concurrently setting the first shunt SQUID #1 108 and the second shunt SQUID #2 110 to the 'ON' state to provide current paths for both the first resonator device #1 102 and the second resonator device #2 106 to ground.

In one example, the control device 116 can include a controller and the tunable coupling circuit 118 can includes a first flux control loop and a second flux control loop. The first flux control loop can be set to induce a fixed or static bias in the coupling SQUID 104 such that the coupling SQUID 104 is set to a high inductive impedance setting. The second flux control loop can be coupled to the coupling SQUID 104, the first shunt SQUID #1 108 and the second shunt SQUID #2 110. The second flux control loop can be variable or dynamic and can be set to induce a variable flux in each of the coupling SQUID 104, the first shunt SQUID #1 108 and the second shunt SQUID #2 110. For example, the variable flux can be set to a substantially zero flux in a first state, which provides zero flux to the coupling SQUID 104, the first shunt SQUID #1 108 and the second shunt SQUID #2 110. Therefore, the coupling SQUID 104 is set to an 'OFF' or high impedance state, and the first shunt SQUID #1 108 and the second shunt SQUID #2 110 are set to a low impedance state or 'ON' state coupling the first resonator device #1 102 to ground and second resonator device #2 106 to ground, while the first resonator device #1 102 and the second resonator device #2 106 are decoupled from one another. Alternatively, the variable flux can be set to provide a given flux in a second state. This causes the first shunt SQUID #1 108 and the second shunt SQUID #2 110 to have flux, which sets the first shunt SQUID #1 108 and the second shunt SQUID #2 110 to a high impedance. Concurrently, the flux added to or subtracted from the second flux control loop adds to or subtracts from flux already induced in the coupling SQUID 104 from the first flux control loop, such that the coupling SQUID 104 is set to a low impedance state coupling the first resonator device #1 102 and the second resonator device #2 106 to one another.

Figure 2:
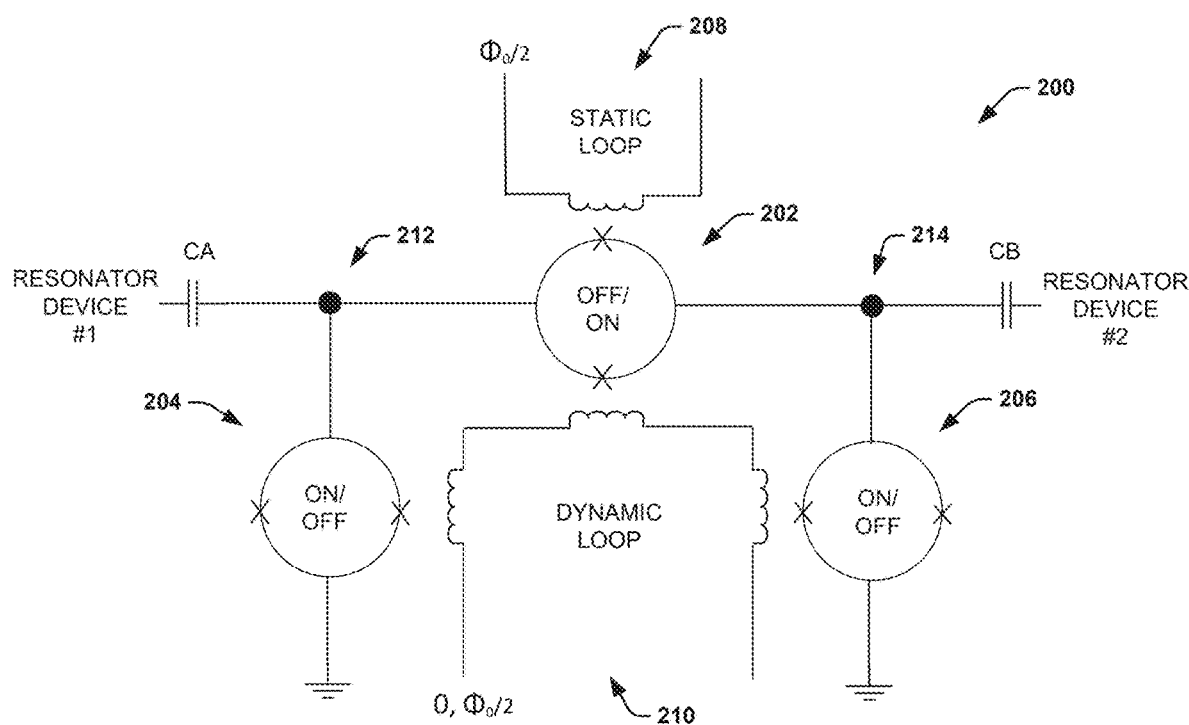
FIG. 2 illustrates a schematic diagram of an example tunable coupling circuit.

FIG. 2 illustrates a schematic diagram of an example tunable coupling circuit 200. The circuit schematic, illustrated in FIG. 2 shows an inductive "pi" network of SQUIDS connecting two coupling capacitors. In a decoupled state, a coupling SQUID 202 is biased to a high inductive impedance with a half flux quantum of applied flux. A first shunt SQUID 204 and a second shunt SQUID 206 are kept at a low impedance with zero applied flux, permitting currents to be shunted to ground. The circuit's principle of operation relies on the fact that the impedance of the coupling SQUID can be lowered while the impedances of the shunt SQUIDs are concurrently raised to provide an efficient coupled state using a single global bias line. Thus, for a given change in the global bias current, the circuit's coupling rate shifts more dramatically than would otherwise be possible with static inductances. This in turn permits smaller coupling capacitors to be used to achieve a given target coupling rate. Alternatively, the impedance of the coupling SQUID can be raised, while the impedances of the shunt SQUIDs are concurrently lowered using the same single global bus line. This allows for an efficient decoupled state mitigating leakage coupling between the first resonator device #1 and the second resonator device #2 in the decoupled state.

Referring specifically to the details of FIG. 2, the tunable coupler circuit 200 includes the coupling SQUID 202 configured to have a first end coupled to a first resonator device #1 through a first coupling capacitor CA via a first coupling node 212. The coupling SQUID 202 is configured to have a second end coupled to a second resonator device #2 through a second coupling capacitor CB via a second coupling node 212. The first and second coupling capacitors CA and CB have a value of less than or equal to 10 femtofarads (fF) (e.g., about 7 (fF)). The first shunt SQUID 204 is coupled between the first coupling node 212 and ground and a second shunt SQUID 206 is coupled between the second coupling node 214 and ground. The coupling SQUID 202, the first shunt SQUID 204 and the second shunt SQUID 206 are each two JJ SQUID devices, but one or more of them could be a single JJ device or a triple JJ device. In one example, the first shunt SQUID 204 and the second shunt SQUID 206 include two 300 nA JJs, and the coupling SQUID 201 includes two 100 nA JJs.

The tunable coupler circuit 200 includes a first flux control loop 208 and a second flux control loop 210. The first flux control loop 208 can be set to induce a fixed or static bias in the coupling SQUID 202 such that the coupling SQUID 202 is set to a high inductive impedance setting. For example, the fixed or static flux can be set to be a half of flux quantum $\varphi_0/2$, where $\varphi_0/2$ is equal to 2.067833848 . . . ×10$^{-15}$ webers (wb). The second flux control loop 210 can be coupled to the coupling SQUID 202, the first shunt SQUID 204 and the second shunt SQUID 206. The second flux control loop 210 is variable or dynamic and can be set to induce a variable flux in each of the coupling SQUID 202, the first shunt SQUID 204 and the second shunt SQUID 206.

For example, the variable flux can be set to a substantially zero flux in a first state, which provides zero flux to the coupling SQUID 202, the first shunt SQUID 204 and the second shunt SQUID 206. Therefore, the coupling SQUID 202 is set to an 'OFF' or high impedance state, and the first shunt SQUID 204 and the second shunt SQUID 206 are set to a low impedance state or 'ON' state coupling the first resonator device #1 to ground and second resonator device #2 to ground, while the first resonator device #1 and the second resonator device #2 are concurrently decoupled from one another.

Alternatively, the variable flux of the second control loop 210 can be set to a half of flux quantum $\varphi_0/2$ in a second state. This causes the first shunt SQUID 204 and the second shunt SQUID 206 to have a half of flux quantum $\varphi_0/2$, which sets the first shunt SQUID 204 and the second shunt SQUID 206 to a high impedance turning "OFF" both the first shunt SQUID 204 and the second shunt SQUID 206. Concurrently, the half of flux quantum from the second flux control loop 210 adds to or subtracts from the half of flux quantum induced in the coupling SQUID 202 induced from the first flux control loop 208, such that the coupling SQUID 202 is set to a low impedance state turning "ON" the coupling SQUID 202 and coupling the first resonator device #1 and the second resonator device #2 to one another.

Figure 3:
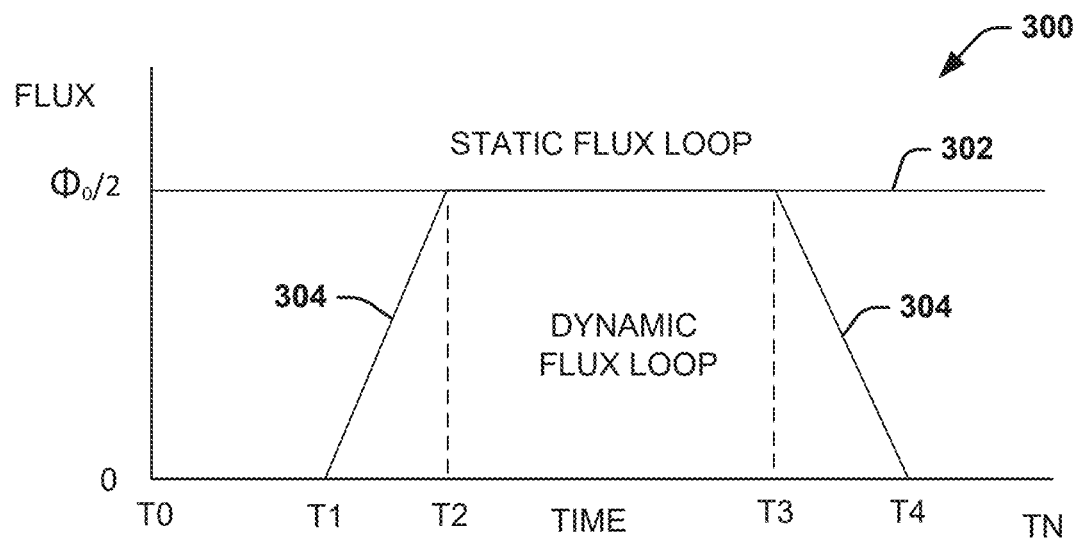
FIG. 3 illustrates a graph of flux provided to the first flux control loop and the second flux control loop versus time.

FIG. 3 illustrates a graph 300 of flux provided to the first flux control loop 208 and the second flux control loop 210 versus time. As illustrated in the graph 300, a static fixed flux 302 of a half of flux quantum $\varphi_0/2$ is provided to the first flux control loop 208 or the static flux loop from a time T0 to a time TN, where time TN is greater than a time T2. The second control loop is provided a dynamic flux 204. At time T0, zero flux is provided to the second flux control loop 210 or dynamic flux loop. This causes the coupling SQUID 202 to be set to an 'OFF' or high impedance state, and the first shunt SQUID 204 and the second shunt SQUID 206 set to a low impedance state or 'ON' state coupling the first resonator device #1 to ground and second resonator device #2 to ground, while the first resonator device #1 and the second resonator device #2 are concurrently decoupled from one another.

Figure 4:
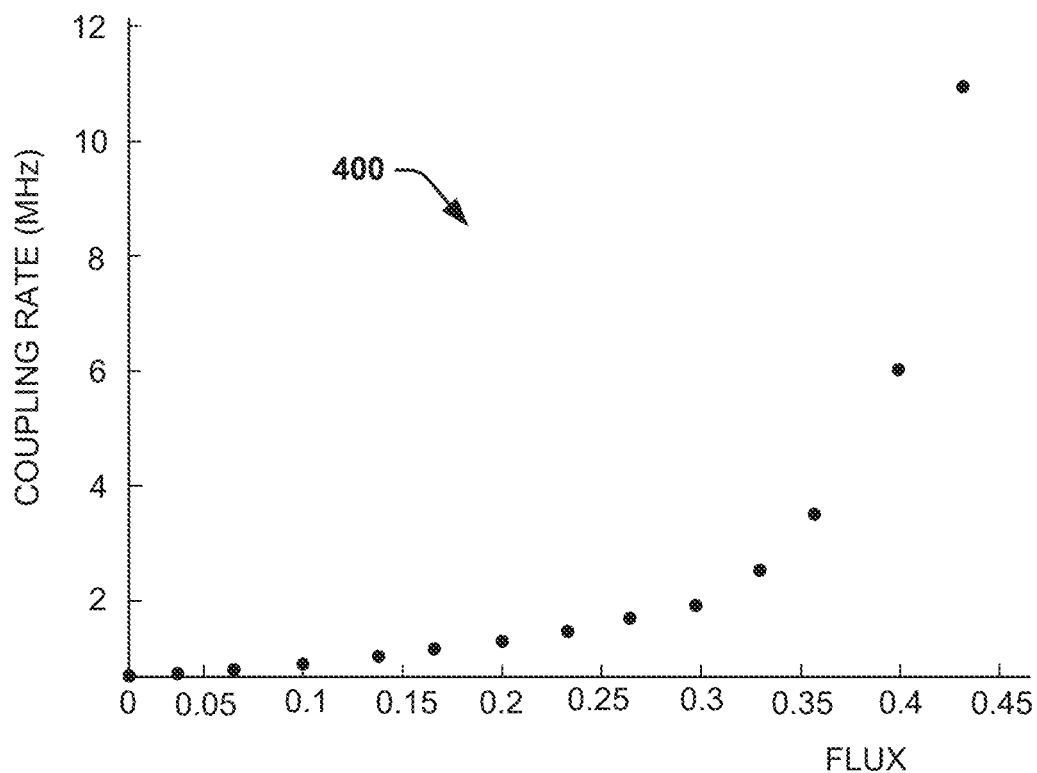
FIG. 4 illustrates a graph of coupling rate versus fast flux for the case where the mutual inductance to the center SQUID loop in FIG. 2 is half of that of the shunting loops.

At time T1, flux 304 is provided to the second flux control loop 210 or dynamic flux loop until the flux 304 reaches a half of flux quantum $\varphi_0/2$ at T2. This causes the coupling SQUID 202 to be set to an 'OFF' or high impedance state, and the first shunt SQUID 204 and the second shunt SQUID 206 set to a low impedance state or 'ON' state coupling the first resonator device #1 to ground and second resonator device #2 to ground, while the first resonator device #1 and the second resonator device #2 are concurrently decoupled from one another. Next, at a time T3, flux 304 is reduced until it reaches zero again at a time T4 retuning the coupling SQUID 202 to an 'OFF' or high impedance state, and the first shunt SQUID 204 and the second shunt SQUID 206 a low impedance state or 'ON' state coupling the first resonator device #1 to ground and second resonator device #2 to ground, while the first resonator device #1 and the second resonator device #2 are concurrently decoupled from one another FIG. 4 illustrates a graph 400 of coupling rate versus flux amplitude for the case where the mutual inductance to the coupling SQUID in FIG. 2 is half of that of the shunt SQUIDs. The abscissa corresponds to the flux applied to the shunt SQUID loops. The coupling rate can be selected based on the selected flux amplitude. As shown in the graph, a small or zero flux provides essentially no coupling between the resonator devices coupled to the tunable coupler circuit. However, the coupling rate maximizes as the induced flux pass 0.45 of a flux quantum. Values below 0.45 flux quantum can be selected to tune the amount of coupling between the resonator devices, while small values of flux assure a turn 'off' of the shunt SQUIDs or coupling SQUID. A slow change in flux assures a smooth transition between coupling rates.

Figure 5:
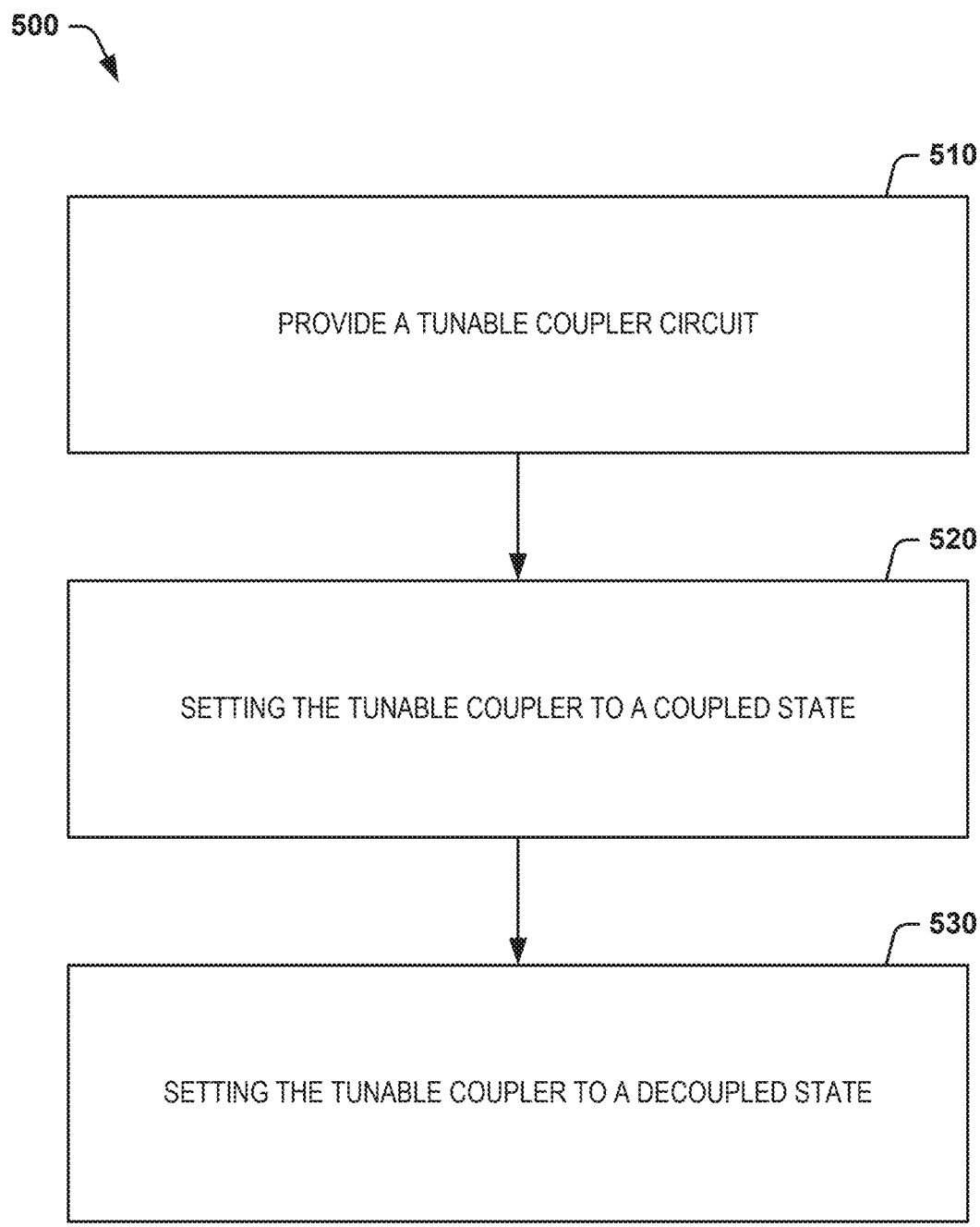
FIG. 5 illustrates an example flow diagram of a method for coupling and decoupling a first resonator device and a second resonator device.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 500 for coupling and decoupling a first resonator device and a second resonator device. At 510, a tunable coupler circuit is provided having a coupling SQUID with a first end coupled to a first resonator device and a first shunt SQUID coupled to ground, and a second end coupled to a second resonator device and a second shunt SQUID coupled to ground. At 520, the tunable coupler circuit is set to a decoupled state by concurrently providing a first flux to the coupling SQUID to set the coupling SQUID to a high impedance state, while concurrently providing a second flux to the first shunt SQUID and the second shunt SQUID to set the first shunt SQUID and the second shunt SQUID to a low impedance state. This provides for an 'ON' state of the shunt SQUIDS to allow the first and second resonator device to have a path to ground, while concurrently providing an 'OFF' state to the coupling SQUID to decouple the first and second resonator devices from one another. At 530, the tunable coupler circuit is set to a coupled state by concurrently providing a third flux to the coupling SQUID to set the coupling SQUID to a low impedance state, while concurrently providing a fourth flux to the first shunt SQUID and the second shunt SQUID to set the first shunt SQUID and the second shunt SQUID to a high impedance state. This provides for an 'OFF' state of the shunt SQUIDS to allow the first and second resonator device to be decoupled from ground, while concurrently providing an 'ON' state to the coupling SQUID to couple the first and second resonator devices to one another. It is to be appreciated that 520 and 530 can be executed in a different order or independently at times where a coupled or decoupled state may be set for a desired length of time.

In one example, the first flux is a fixed flux provided to the coupling SQUID during both the coupled state and the decoupled state, the second flux is zero flux, and the third flux is substantially equal to the fourth flux plus or minus the first flux. In another example, the first flux is a half of flux quantum $\varphi_0/2$, the second flux is zero flux, the third flux is one of zero and a flux quantum $\varphi_0/2$, and the fourth flux is a half of flux quantum $\varphi_0/2$.

What have been described above are examples of the present disclosure. It is, of course, not possible to describe every conceivable combination of components or methodologies for purposes of describing the present disclosure, but one of ordinary skill in the art will recognize that many further combinations and permutations of the present disclosure are possible. Accordingly, the present disclosure is intended to embrace all such alterations, modifications and variations that fall within the spirit and scope of the appended claims.

What is claimed is:

1. A tunable coupler circuit comprising:
   a coupling superconductor quantum interference device (SQUID) having a first end configured to be coupled to a first resonator device through a first coupling node and a second end configured to be coupled to a second resonator device through a second coupling node;
   a first shunt SQUID coupled between the first coupling node and ground; and
   a second shunt SQUID coupled between the second coupling node and ground,
   wherein the tunable coupler circuit is configured to switch between a coupled state by the setting of the coupling SQUID to a low impedance state to couple the first resonator device and the second resonator device together while concurrently setting the first shunt SQUID and the second shunt SQUID to a high impedance state and a decoupled state by setting the coupling SQUID to a high impedance state to decouple the first resonator device and the second resonator device while concurrently setting the first shunt SQUID and the second shunt SQUID to a low impedance state to provide current paths for both the first resonator device to ground and the second resonator device to ground.

2. The tunable coupler circuit of claim 1, further comprising:
   a first flux control loop inductively coupled to the coupling SQUID for providing a first flux;
   a second flux control loop inductively coupled to the coupling SQUID, the first shunt SQUID and the second shunt SQUID for providing a second flux.

3. The tunable coupler circuit of claim 2, wherein the first flux is a fixed flux and the second flux switches between a second flux and a third flux.

4. The tunable coupler circuit of claim 3, wherein the first flux is a half of flux quantum $\varphi_0/2$, the second flux is zero flux and the third flux is a half of flux quantum $\varphi_0/2$.

5. The tunable coupler circuit of claim 1, wherein one or more control loops are controlled by a control device to control the switching the tunable coupler circuit between a coupled state and a decoupled state.

6. The tunable coupler circuit of claim 1, wherein the coupling SQUID is a two Josephson junction (JJ) device.

7. The tunable coupler circuit of claim 1, wherein the first shunt SQUID and the second shunt SQUID are both a two Josephson junction (JJ) devices.

8. The tunable coupler circuit of claim 1, wherein the coupling SQUID, the first shunt SQUID and the second shunt SQUID are each one of a one, two or three Josephson junction (JJ) device.

9. A system comprising:
   a first resonator device having a first resonant frequency;
   a second resonator device having a second resonant frequency; and
   a tunable coupler circuit coupled between the first resonator device and the second resonator device, the tunable coupler circuit including:
      a coupling superconductor quantum interference device (SQUID) having a first end coupled to the first resonator device through a first coupling node and a second end coupled to the second resonator device through a second coupling node;
      a first shunt SQUID coupled between the first coupling node and ground; and
      a second shunt SQUID coupled between the second coupling node and ground,
      wherein the tunable coupler circuit is configured to switch between a coupled state by the setting of the coupling SQUID to a low impedance state to couple the first resonator device and the second resonator device together while concurrently setting the first shunt SQUID and the second shunt SQUID to a high impedance state and a decoupled state by setting the coupling SQUID to a high impedance state to decouple the first resonator device and the second resonator device while concurrently setting the first shunt SQUID and the second shunt SQUID to a low impedance state to provide current paths for both the first resonator device to ground and the second resonator device to ground; and
      a control device configured to switch the tunable coupled circuit between the coupled state and the decoupled state.

10. The system of claim 9, further comprising:
    a first flux control loop inductively coupled to the coupling SQUID for providing a first flux;
    a second flux control loop inductively coupled to the coupling SQUID, the first shunt SQUID and the second shunt SQUID for providing a second flux.

11. The system of claim 10, wherein the first flux is a fixed flux and the second flux switches between a second flux and a third flux.

12. The system of claim 11, wherein the first flux is a half of flux quantum $\varphi_0/2$, the second flux is zero flux and the third flux is a half of flux quantum $\varphi_0/2$.

13. The system of claim 9, wherein one or more control loops are controlled by a control device to control the switching of the tunable coupler circuit between a coupled state and a decoupled state.

14. The system of claim 9, wherein the first shunt SQUID and the second shunt SQUID are both a two Josephson junction (JJ) device.

15. The system of claim 9, further comprising a first coupling capacitor disposed between the first resonator device and the first coupling node, and a second coupling capacitor between the second resonator circuit and the second coupling node.

16. A method of coupling and decoupling first and second resonator devices via a tunable coupler circuit having a coupling superconductor quantum interference device (SQUID) having a first end coupled to a first resonator device and a first shunt SQUID coupled to ground, and a second end coupled to a second resonator device and aa second shunt SQUID coupled to ground, the method comprising:

setting the tunable coupler circuit to a decoupled state by concurrently providing a first flux to the coupling SQUID to set the coupling SQUID to a high impedance state, while concurrently providing a second flux to the first shunt SQUID and the second shunt SQUID to set the first shunt SQUID and the second shunt SQUID to a low impedance state; or setting the tunable coupler circuit to a coupled state by concurrently providing a third flux to the coupling SQUID to set the coupling SQUID to a low impedance state, while concurrently providing a fourth flux to the first shunt SQUID and the second shunt SQUID to set the first shunt SQUID and the second shunt SQUID to a high impedance state.

17. The method of claim 16, wherein the first flux is a fixed flux provided to the coupling SQUID during both the coupled state and the decoupled state.

18. The method of claim 17, wherein the second flux is zero flux.

19. The method of claim 18, wherein the third flux is substantially equal to the fourth flux plus or minus the first flux.

20. The method of claim 19, wherein the first flux is a half of flux quantum $\varphi_0/2$, the second flux is zero flux, the third flux is one of zero and a flux quantum $\varphi_0/2$, and the fourth flux is a half of flux quantum $\varphi_0/2$.

* * * * *